US008399889B2

(12) United States Patent
Wu et al.

(10) Patent No.: US 8,399,889 B2
(45) Date of Patent: Mar. 19, 2013

(54) ORGANIC LIGHT EMITTING DIODE AND ORGANIC SOLAR CELL STACK

(75) Inventors: Yue Wu, San Gabriel, CA (US); Travis Currier, Pico Rivera, CA (US); Yuyi Li, San Francisco, CA (US); Szu-Ting Tsai, San Gabriel, CA (US)

(73) Assignee: Solarmer Energy, Inc., El Monte, CA (US)

( * ) Notice: Subject to any disclaimer, the term of this patent is extended or adjusted under 35 U.S.C. 154(b) by 605 days.

(21) Appl. No.: 12/614,722

(22) Filed: Nov. 9, 2009

(65) Prior Publication Data
US 2011/0108856 A1 May 12, 2011

(51) Int. Cl.
H01L 27/15 (2006.01)
H01L 29/26 (2006.01)
H01L 31/12 (2006.01)
H01L 33/00 (2010.01)
H01L 51/00 (2006.01)
H01L 21/00 (2006.01)

(52) U.S. Cl. ....... 257/80; 257/40; 257/82; 257/E51.018; 257/E33.076

(58) Field of Classification Search .................... 257/40, 257/80, 82, E51.018, E33.076
See application file for complete search history.

(56) References Cited

U.S. PATENT DOCUMENTS

| 3,589,946 A | 6/1971 | Tarneja et al. |
| 4,060,426 A | 11/1977 | Zinchuk |
| 4,104,084 A | 8/1978 | Evans, Jr. |
| 4,252,573 A | 2/1981 | Boer et al. |
| 4,400,868 A | 8/1983 | Antypas et al. |
| 4,528,082 A | 7/1985 | Moustakas et al. |
| 4,543,443 A | 9/1985 | Moeller et al. |

(Continued)

FOREIGN PATENT DOCUMENTS

| EP | 0949850 | 10/1999 |
| GB | 2308182 | 6/1997 |
| WO | WO 93-21662 | 10/1993 |
| WO | WO 2004-112161 | 12/2004 |
| WO | WO 2006-133265 | 12/2006 |

(Continued)

OTHER PUBLICATIONS

International Search Report for International Application No. PCT/US2009/037197, dated Oct. 29, 2009.

(Continued)

*Primary Examiner* — Matthew W Such
*Assistant Examiner* — Jeremy Joy
(74) *Attorney, Agent, or Firm* — Hema Vakharia-Rao; Nixon Peabody LLP

(57) ABSTRACT

This disclosure relates to an organic solar cell and an organic light emitting diode stack. The stack comprises a solar cell portion having a substrate, an electrode, an active layer, and a second electrode. The stack also comprises a light emitting diode portion having a substrate, an electrode, an active layer, and a second electrode. The solar cell portion is laminated to the light emitting diode portion to form a stack. In a variation, the stack comprises a solar cell portion that includes a substrate, an electrode and an active layer. In this variation, there is a connection portion that includes a second substrate, having, a second electrode on one side and a third electrode on the other side of the second substrate. Also in this variation, there is also a light emitting diode portion, which includes a third substrate, an electrode on the third substrate and a second active layer. The solar cell portion is laminated to the connection portion and the connection portion is laminated to the light emitting diode portion to form a stack.

14 Claims, 6 Drawing Sheets

U.S. PATENT DOCUMENTS

| | | | |
|---|---|---|---|
| 4,574,160 A | 3/1986 | Cull et al. |
| 4,586,988 A | 5/1986 | Nath et al. |
| 4,590,327 A | 5/1986 | Nath et al. |
| 4,595,790 A | 6/1986 | Basol |
| 4,647,711 A | 3/1987 | Basol et al. |
| 4,663,495 A | 5/1987 | Berman et al. |
| 4,675,468 A | 6/1987 | Basol et al. |
| 4,680,422 A | 7/1987 | Stanbery |
| 4,686,323 A | 8/1987 | Biter et al. |
| 4,695,674 A | 9/1987 | Bar-on |
| 4,808,242 A | 2/1989 | Murata et al. |
| 4,865,999 A | 9/1989 | Xi et al. |
| 5,069,727 A | 12/1991 | Kouzuma et al. |
| 5,133,810 A | 7/1992 | Morizane et al. |
| 5,176,758 A | 1/1993 | Nath et al. |
| 5,181,968 A | 1/1993 | Nath et al. |
| 5,288,338 A | 2/1994 | Morikawa |
| 5,298,086 A | 3/1994 | Guha et al. |
| 5,458,694 A | 10/1995 | Nuyen |
| 5,479,043 A | 12/1995 | Nuyen |
| 5,723,873 A | 3/1998 | Yang |
| 5,797,998 A | 8/1998 | Wenham et al. |
| 5,942,048 A | 8/1999 | Fukisaki et al. |
| 6,121,542 A | 9/2000 | Shiotsuka et al. |
| 6,278,055 B1 | 8/2001 | Forrest et al. |
| 6,297,495 B1 | 10/2001 | Bulovic et al. |
| 6,320,117 B1 | 11/2001 | Campbell et al. |
| 6,352,777 B1 | 3/2002 | Bulovic et al. |
| 6,356,031 B1 * | 3/2002 | Thagard et al. ............. 315/169.3 |
| 6,403,984 B1 * | 6/2002 | Kruangam ....................... 257/80 |
| 6,420,031 B1 | 7/2002 | Parthasarathy et al. |
| 6,469,437 B1 | 10/2002 | Parthasarathy et al. |
| 6,509,204 B2 | 1/2003 | Campbell |
| 6,515,030 B1 | 2/2003 | Bechtel |
| 6,538,194 B1 | 3/2003 | Koyanagi et al. |
| 6,657,378 B2 | 12/2003 | Forrest et al. |
| 6,913,943 B2 | 7/2005 | Cunningham et al. |
| 6,936,761 B2 | 8/2005 | Pichler |
| 7,022,910 B2 | 4/2006 | Gaudiana et al. |
| 7,105,237 B2 | 9/2006 | Sotzing |
| 7,163,831 B2 | 1/2007 | Hasegawa et al. |
| 7,737,356 B2 | 6/2010 | Goldstein |
| 2002/0009015 A1 | 1/2002 | Laugharn |
| 2004/0099307 A1 | 5/2004 | Sun |
| 2004/0113546 A1 | 6/2004 | Forrest et al. |
| 2004/0265623 A1 | 12/2004 | Stegamat et al. |
| 2005/0023975 A1 * | 2/2005 | Lee et al. ....................... 313/512 |
| 2005/0074629 A1 | 4/2005 | Forrest et al. |
| 2005/0126629 A1 | 6/2005 | Okada et al. |
| 2005/0150543 A1 | 7/2005 | Nakashima et al. |
| 2005/0164019 A1 | 7/2005 | Liu et al. |
| 2005/0205127 A1 | 9/2005 | Watanabe et al. |
| 2005/0260777 A1 * | 11/2005 | Brabec et al. .................... 438/20 |
| 2005/0268962 A1 | 12/2005 | Gaudiana et al. |
| 2005/0275340 A1 | 12/2005 | Choi et al. |
| 2006/0000506 A1 | 1/2006 | Brabec et al. |
| 2006/0065301 A1 | 3/2006 | Miyoshi |
| 2006/0071200 A1 | 4/2006 | Nordquist et al. |
| 2006/0090791 A1 | 5/2006 | Gaudiana et al. |
| 2006/0141662 A1 | 6/2006 | Brabec et al. |
| 2006/0227531 A1 * | 10/2006 | Iou .................................. 362/84 |
| 2006/0234065 A1 | 10/2006 | Ohno et al. |
| 2006/0292736 A1 | 12/2006 | Lee et al. |
| 2007/0000537 A1 | 1/2007 | Leidholm et al. |
| 2007/0028959 A1 | 2/2007 | Lee et al. |
| 2007/0044836 A1 | 3/2007 | Forrest et al. |
| 2007/0068569 A1 | 3/2007 | Nam et al. |
| 2007/0079869 A1 | 4/2007 | Yukinobu |
| 2007/0095389 A1 | 5/2007 | Cho et al. |
| 2007/0095391 A1 | 5/2007 | Sun |
| 2007/0131277 A1 | 6/2007 | Gaudiana et al. |
| 2007/0178619 A1 | 8/2007 | Forrest et al. |
| 2007/0181179 A1 | 8/2007 | Brabec et al. |
| 2007/0184576 A1 | 8/2007 | Chang et al. |
| 2007/0186971 A1 | 8/2007 | Lochun et al. |
| 2007/0190789 A1 | 8/2007 | Carter et al. |
| 2007/0193621 A1 | 8/2007 | Brabec et al. |
| 2007/0193622 A1 | 8/2007 | Sai |
| 2007/0215879 A1 | 9/2007 | Liu et al. |
| 2007/0216300 A1 | 9/2007 | Lee et al. |
| 2007/0235074 A1 | 10/2007 | Henley et al. |
| 2007/0246704 A1 | 10/2007 | Heeney et al. |
| 2007/0251570 A1 | 11/2007 | Eckert et al. |
| 2007/0267055 A1 | 11/2007 | Gaudiana et al. |
| 2007/0272296 A1 | 11/2007 | Brabec et al. |
| 2007/0295387 A1 | 12/2007 | Adriani et al. |
| 2008/0006324 A1 | 1/2008 | Berke et al. |
| 2008/0029147 A1 | 2/2008 | Yang et al. |
| 2008/0190479 A1 * | 8/2008 | Hsieh et al. ................... 136/246 |
| 2008/0193717 A1 * | 8/2008 | Jongerden et al. ............. 428/142 |
| 2009/0108757 A1 * | 4/2009 | Lee et al. ......................... 315/51 |
| 2009/0223079 A1 | 9/2009 | Myong |
| 2009/0229667 A1 | 9/2009 | Shrotriya et al. |
| 2009/0269621 A1 | 10/2009 | Lifka et al. |
| 2010/0018581 A1 | 1/2010 | Shrotriya et al. |
| 2010/0065834 A1 * | 3/2010 | Hammond ...................... 257/40 |
| 2010/0276071 A1 | 11/2010 | Li et al. |
| 2010/0308754 A1 * | 12/2010 | Gough et al. .................. 315/363 |
| 2011/0008926 A1 | 1/2011 | Irvin et al. |
| 2011/0017956 A1 | 1/2011 | Hou et al. |

FOREIGN PATENT DOCUMENTS

| | | |
|---|---|---|
| WO | WO 2007-005617 | 1/2007 |
| WO | WO 2007-070395 | 6/2007 |
| WO | WO 2008-016691 | 2/2008 |
| WO | WO 2009 114832 | 9/2009 |
| WO | WO 2011-011545 | 1/2011 |

OTHER PUBLICATIONS

International Search Report for International Application No. PCT/US2010/055829, dated Jan. 10, 2011.

International Preliminary Examination Report for International Application No. PCT/US2009/037197, dated Sep. 23, 2010.

Office Action for U.S. Appl. No. 12/179,387, dated Jul. 12, 2010, 10 pages.

Office Action for U.S. Appl. No. 12/049,252, dated May 27, 2010, 33 pages.

Office Action for U.S. Appl. No. 12/049,252, dated Dec. 1, 2009, 25 pages.

Office Action for U.S. Appl. No. 12/049,252, dated Dec. 27, 2010, 40 pages.

J. Huang, et al., "Achieving High-Efficiency Polymer White-light-Emitting Devices", Advanced Materials 2006, vol. 18, pp. 114-117.

G. Li, et al., "High-Efficiency Solution Processable Polymer Photovoltaic Cells by Self-Organization of Polymer Blends", Nature Materials, Nov. 2005, vol. 4, pp. 864-868.

V. Shrotriya, et al., "Efficient light Harvesting in Multiple-Device Stacked Structure for Polymer Solar Cells", Applied Physics Letters 88,064104.

V. Shrotriya, et al., "Transition Metal Oxides as the Buffer Layer for Polymer Photovoltaic Cells", Applied Physics Letters 88, 073508,.

G. Li, et al., "Efficient Inverted Polymer Solar Cells", Applied Physics Letters 88, 253503.

C. Chu, et al., "Integration of Organic light-Emitting Diode and Organic Transistor Via a Tandem Structure", Applied Physics Letters 86, 253503.

H. Liao, et al., "Highly Efficient Inverted Polymer Solar Cell by Low Termperature Annealing of CS2C03 Interlayer", Applied Physics Letters 92,173303.

V. Shrotriya, et al., Translucent Plastic Solar Cells—Novel Devices and Their Applications, Conference, USA 2007.

Office Action for U.S. Appl. No. 12/499,460, dated Jan. 21, 2011, 9 pages.

Office Action for U.S. Appl. No. 12/179,387, dated Mar. 7, 2011.

Li et al., Manipulating regioregular poly(3-hexylthiophene): [6,6]-phenyl-C61-butyric acid methyl ester blends-route towards high efficiency polymer solar cells, J. Mater. Chem., 2007, vol. 17, pp. 3126-3140.

PCT Search Report and Written Opinion mailed Sep. 15, 2010 for PCT/US10/42794.

* cited by examiner

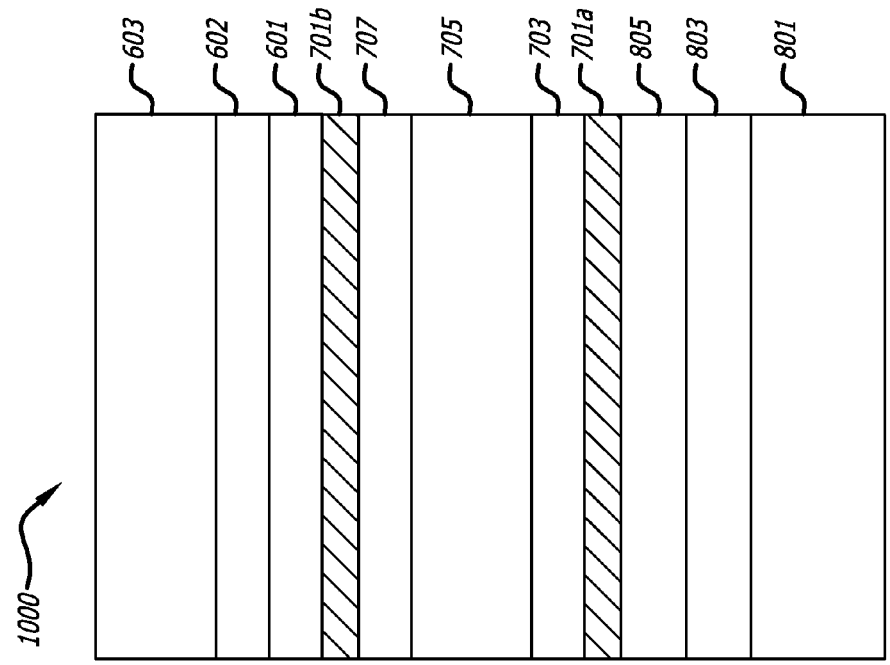
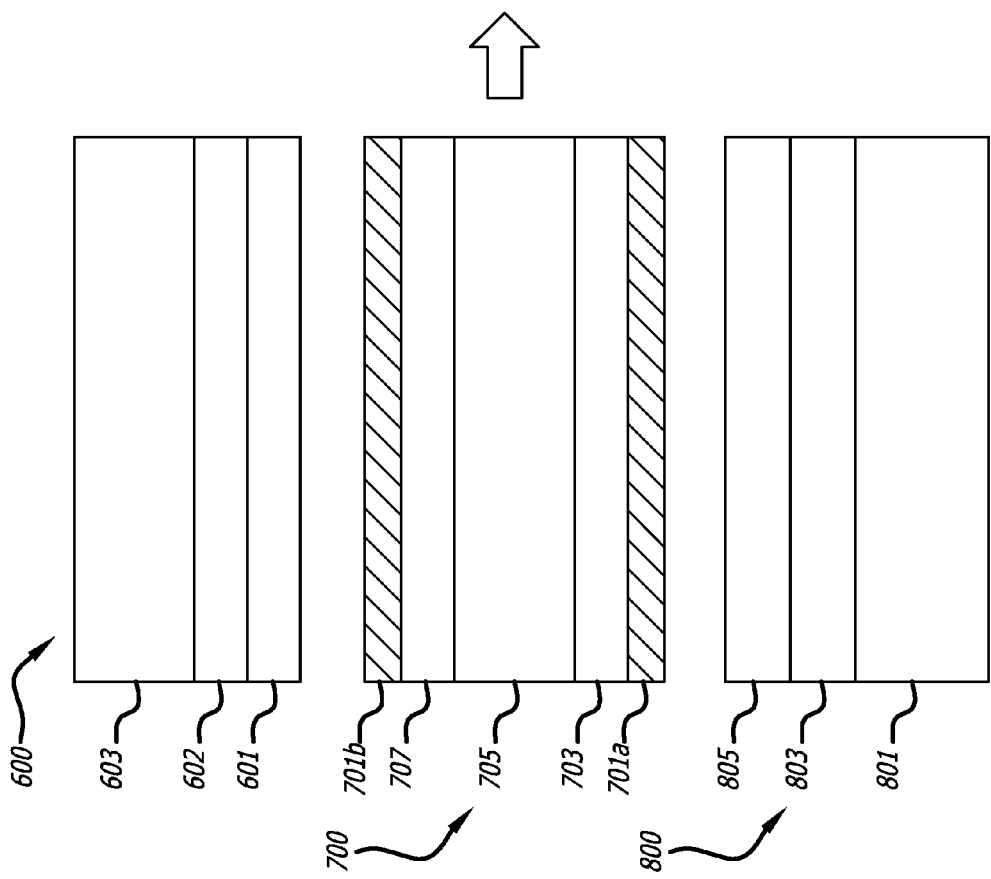

_US 8,399,889 B2_

ORGANIC LIGHT EMITTING DIODE AND ORGANIC SOLAR CELL STACK

BACKGROUND

This disclosure relates to stacking a transparent or translucent PV cell and an LED together through several methods. Particularly, the present disclosure concerns transparent or translucent organic photovoltaic (OPV) devices and organic light emitting devices (OLED).

SUMMARY

In one instance, there is an organic solar cell and an organic light emitting diode stack. The stack comprises an organic solar cell portion having a first substrate, a first electrode on the first substrate, a first active layer on the first electrode, and a second electrode on the first active layer. There is an organic light emitting diode portion having a second substrate, a third electrode on the second substrate, a second active layer on the third electrode, and a fourth electrode on the second active layer. The organic solar cell portion is laminated to the organic light emitting diode portion such that the fourth electrode of the organic light emitting diode and the second electrode of the organic solar cell are separated by an adhesive.

In another instance, there is organic solar cell and the organic light emitting diode stack that comprises an organic solar cell portion that includes a first substrate, a first electrode on the first substrate and a first active layer on the first electrode. There is a connection portion that includes a second substrate. The second substrate has a second electrode on one side and a third electrode on the other side of the second substrate. There is an organic light emitting diode portion. The organic light emitting diode portion includes a third substrate, a fourth electrode on the third substrate and a second active layer on the fourth electrode.

The organic solar cell portion is laminated to the connection portion such that the first active layer and the second electrode are separated by a first electronic adhesive layer. The connection portion is laminated to the organic light emitting diode portion such that the second active layer and the third electrode are separated by a second electronic adhesive layer.

DRAWINGS

The above-mentioned features and objects of the present disclosure will become more apparent with reference to the following description taken in conjunction with the accompanying drawings wherein like reference numerals denote like elements and in which:

FIGS. 8A-8B show views of an organic light emitting diode and an organic solar cell stack, in accordance with the present disclosure.

DETAILED DESCRIPTION

Figure 1:
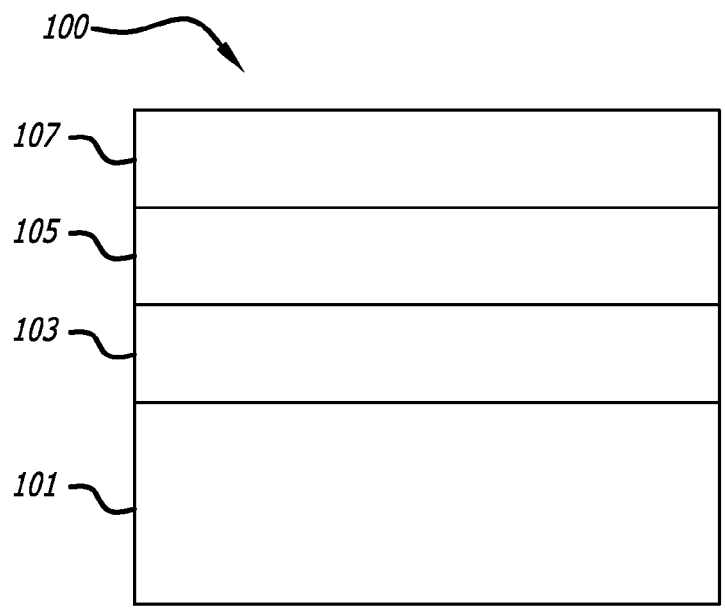
FIG. 1 is a view of an organic light emitting diode, in accordance with the present disclosure.

A solar cell or photovoltaic (PV) is a device that converts light, especially solar irradiation, into electricity. A light emitting diode (LED) is a device that converts electricity into light. The present disclosure focuses on stacking a transparent or translucent PV cell and an LED together through several methods for applications such as 24 hour lighting, commercial advertisement, signs, labels, street lamps, toys, special statues, and the like. Particularly, the present disclosure concerns transparent or translucent organic photovoltaic (OPV) devices and organic light emitting devices (OLED).

Polymer light-emitting diodes (PLED) incorporate an electroluminescent conducting polymer that emits light when a voltage is applied. They are used as a thin film for full-spectrum color displays and require a relatively small amount of power to produce light.

An Organic Light Emitting Diode (OLED) is a Light Emitting Diode (LED) with an active layer that is made of a film of an organic compound or compounds.

When a battery or power supply connected to the OLED applies a voltage across the OLED, the cathode gives electrons to the active layer of organic molecules. The anode injects holes into the active layer of organic molecules. In the active layer, electrons and holes meet each other and combine to form to excitons. The excitons radiatively decay and give up energy in the form of a photon of light.

The color of the light depends on the energy gap of the organic molecule in the active layer. Several different types of organic films can be placed on the same OLED to make different color displays.

OPVs and OLEDs have similar device structures. The structure includes an organic active layer sandwiched between two electrodes: a cathode and an anode. The cathode is typically a low-work function metal such as Calcium (Ca), Aluminum (Al), metal oxides (i.e, modified Indium tin oxide (ITO)) and the anode is typically ITO, Florin doped Tin Oxide (FTO) or other high work function metals. The organic active layer or photo-absorber can be formed by thermal evaporation, spin coating, screen printing, inkjet printing, spray printing, slot die coating, bar coating and the like. The transparency of the organic active layer can be manipulated by adjusting the thickness. In addition, the electrodes can also be transparent, depending on the selection of electrode materials and material thickness, thus both of the OPV and OLED can be made transparent.

Additionally, both OLED and OPV should be encapsulated to increase their lifetime. Encapsulation usually includes a barrier film that is capped on top of the OLED or OPV through an adhesive layer. The barrier film blocks the penetration of water and oxygen into the electrodes and active layer and reduces device degradation.

The present disclosure provides a method to stack the OPV and OLED face to face, therefore the substrates of both OPV and OLED can function as the barrier film to protect the individual devices.

The stacked devices of the present disclosure can include the following features:

1) Transparency: In daytime or with applied light, the stacked device can absorb part of the light and let part of it transmit. At night or without light, the electricity generated and stored can power the integrated OLED and produce light. Therefore the device can illuminate 24 hours or as needed.

2) Efficiency: The active layer in the OLED can produce light under either photo excitation or electrical excitation. Especially, through the suitable selection of materials, the OLED layer can absorb the light in UV or blue range, where OPV sub cells may have less response, and give out light where the attached OPV has a good response. Therefore, the selection of materials can further increase the solar cell efficiency.

3) Color and pattern: Both the OPV and OLED sub-cells can have different colors or patterns. The color of each sub-cell can be the same or the two can form a certain pattern for different purposes and have different colors.

The present disclosure describes two methods to fabricate an OPV and OLED stack. The first method utilizes a completed OPV, a completed OLED, and an adhesive layer, wherein the OPV and OLED are stacked and fixed together with the adhesive. The adhesive provides the adhesion between OPV and OLED through thermal curing, UV curing, or even no requirement of curing if it can provide enough adhesion.

The second method utilizes an OPV active layer coated on a substrate, an OLED active layer on a substrate, and another substrate with electrodes on both sides. The electrodes are coated with an electronic or conducting glue. The OPV layer, OLED layer, and the substrate are stacked and fixed together with the electronic or conducting glue.

A rechargeable battery is connected to both OPV and OLED sub-cell. When illuminated with light, the OPV sub-cell converts light into electricity which can be stored in the rechargeable battery. The stored electricity can power the OLED to emit light when there is no available light source. The OPV or OLED can be patterned so that the stacked cells can used for display, advertisement, signs and label applications.

Figure 6:
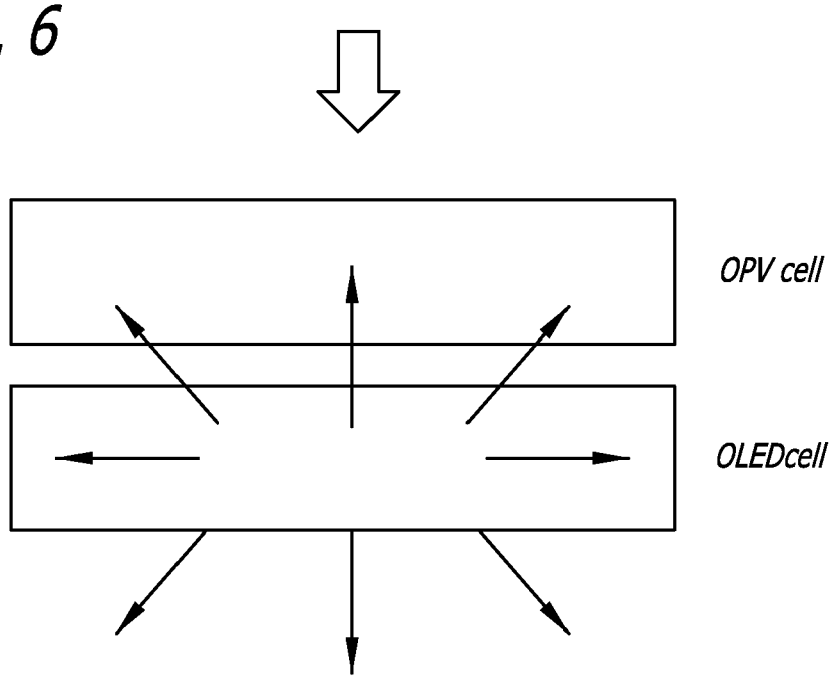
FIG. 6 shows an exemplary configuration of an organic light emitting diode and an organic solar cell stack in accordance with the present disclosure.

Referring to FIG. 6, the stacked device can be used having either the OPV sub cell or OLED sub cell facing the illuminating source. When the OPV sub cell is facing a light source, part of light can be transmitted through the OPV cell to illuminate the OLED cell. The photoactive layer can generate photoluminescence. The light of photoluminescence can be absorbed by the OPV and enhances its efficiency. Meanwhile, the photoluminescence light can have a display effect.

Figure 7:
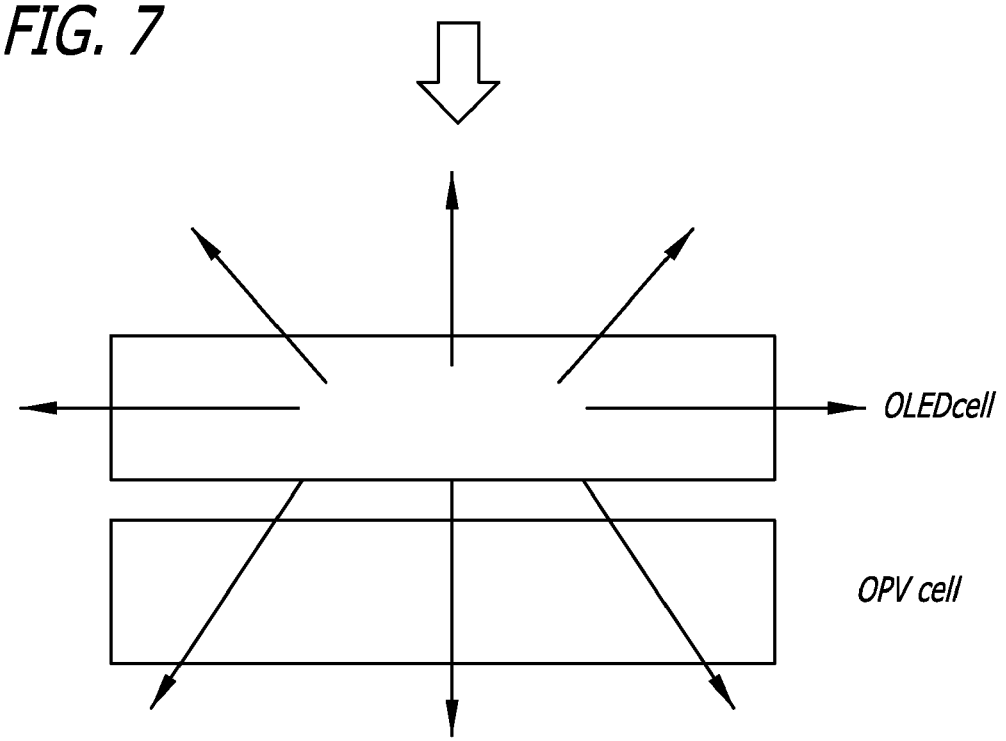
FIG. 7 shows an exemplary configuration of an organic light emitting diode and an organic solar cell stack in accordance with the present disclosure.

Referring to FIG. 7, the OLED side is facing the illuminating source. In addition to the above-mentioned effect, the configuration of FIG. 7 can absorb the short wavelength part of the illuminating light and thus reduce the photo-degradation of the OPV sub-cell.

FIG. 1 shows the structure of an OLED 100 which comprises a substrate 101, two electrodes 103 and 107, and an active layer 105. The active layer 105 can have multiple layers or be a single layer. The substrate 101 can be glass or a plastic such as polyethylene terephthalate (PET), polyethylene naphthalate (PEN), Polycarbonate (PC), transparent barriers, and the like. The substrate 101 provides a barrier from water and oxygen. At least one of electrodes 103 and 107 is transparent for allowing generated light to be visible. Preferably, both electrodes 103 and 107 are transparent. The active layer 105 can include photo-active polymers and small molecules which generate light under optical or electrical excitation.

Figure 2:
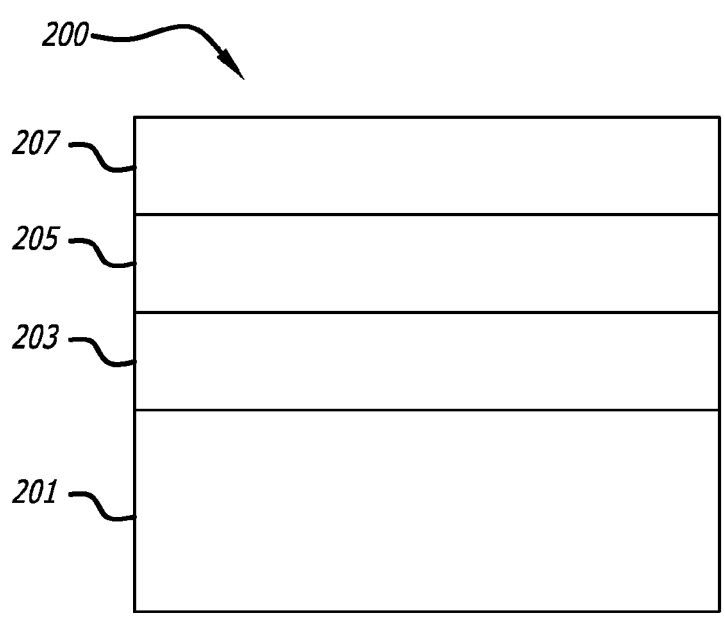
FIG. 2 is a view of an organic solar cell, in accordance with the present disclosure.

FIG. 2 shows an organic solar cell 200 which comprises a substrates 201, two electrodes 203, 207, and an active layer 205. The active layer 205 can have multiple layers or be a single layer. The active layer 205 has the capability to emit light but preferably converts light into electricity. The requirements of substrate 201 are similar to the substrate 101 of the OLED 100. The two electrodes 203 and 207 can be either opaque or transparent. Preferably, both electrodes 203 and 207 are transparent.

Figure 3:
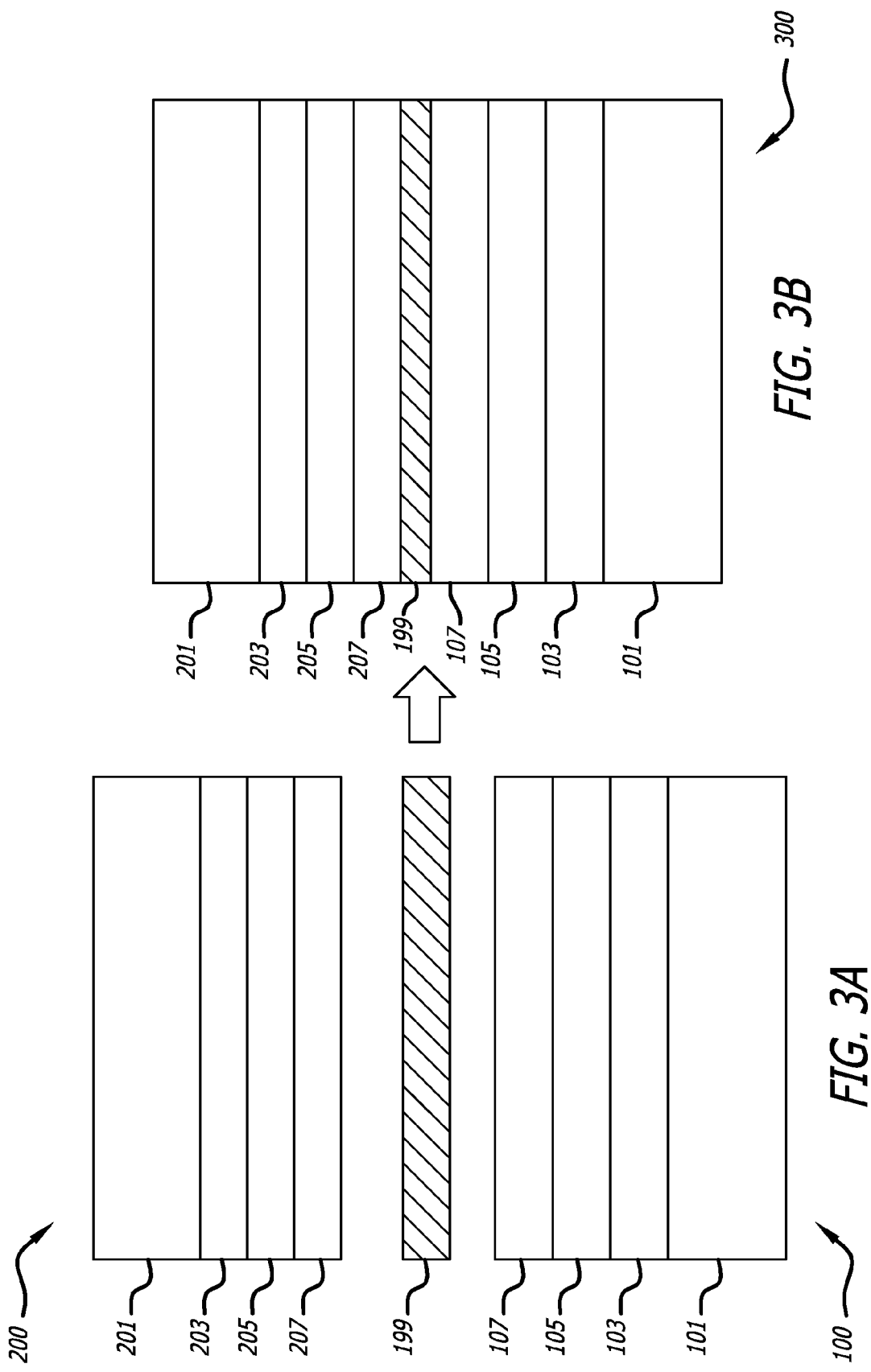
FIG. 3A is a view of an organic light emitting diode, an organic solar cell and an adhesive layer, in accordance with the present disclosure.
FIG. 3B is a view of an organic light emitting diode, an organic solar cell and an adhesive layer, in accordance with the present disclosure.

FIGS. 3A-3B show a stacked cell utilizing the OPV 200 and OLED 100. The OPV 200 and OLED 100 can be either encapsulated or not. An adhesive layer 199 is applied between OLED 100 and OPV 200 to make a stack 300. The adhesive layer 300 provides the mechanical force to hold the OPV 200 and the OLED 100 together. Additionally, the adhesive layer 199 ideally has a water and oxygen barrier property to prevent the penetration of water and oxygen in the lateral direction. The substrates of the OLED and the OPV also function as barriers for blocking the penetration of water and oxygen in the vertical direction.

Figure 4:
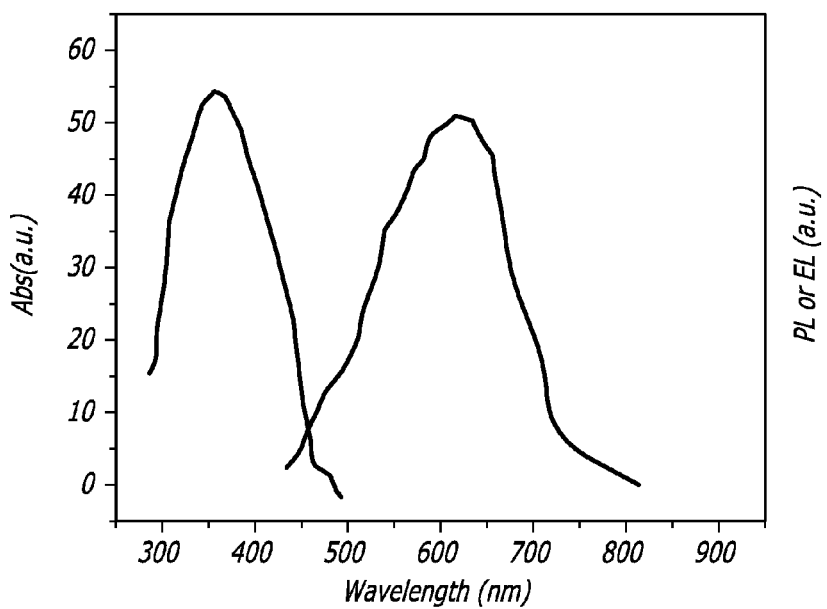
FIG. 4 is a graph illustrating a relationship between absorption and emission spectra of an example substance in an organic light emitting diode sub-cell.

FIG. 4 shows an example absorption and emission spectra of the active layer 105. Typically, the active layer 105 will absorb shorter wavelengths of light and emit longer wavelengths of light. Some materials have absorption ranges from the UV end of the spectrum into the visible range. The emission typically covers the whole visible range. The active layer 105 can be a pure polymer, polymer blends, molecules or a doped system, such as dye doped polymers. Additionally the active layer 105 can be a single layer or be multiple layers which would include a hole transport layer and an electron transport layer.

Figure 5:
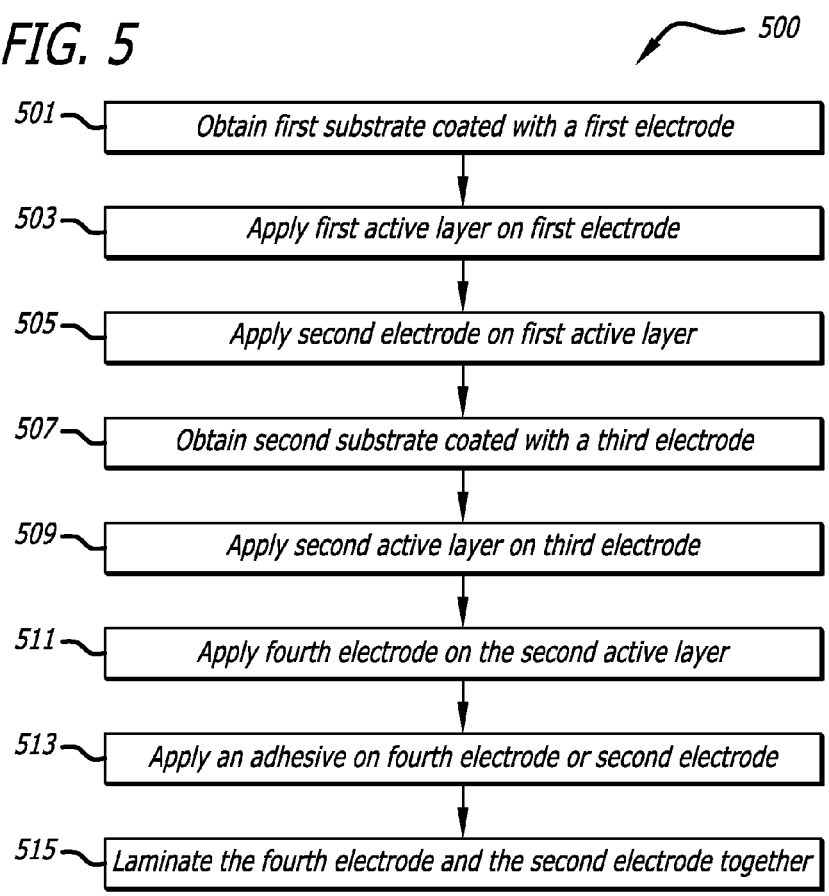
FIG. 5 is a process flow diagram for a method of fabricating an organic solar cell and organic light emitting diode stack, in accordance with the present disclosure.

Referring to FIG. 5, there is a method 500 of fabricating an organic solar cell and organic light emitting diode stack 300. The method 500 can start with the construction of the organic solar cell 200 or it can start with construction of the organic light emitting diode 100—the order does not matter.

In FIG. 5, an organic light emitting diode 100 is constructed or fabricated first. In operation 501a first substrate 101 coated with a first electrode 103 is obtained and a first active layer 105 is applied on the first electrode 103 in operation 503. A second electrode 107 is applied on the first active layer 105 in operation 505.

After the organic light emitting diode 100, the method 500 begins the construction of the organic solar cell 200 by obtaining a second substrate 201 coated with a third electrode 203 in operation 507. A second active layer 205 is applied on the third electrode 203 in operation 509. A fourth electrode 207 is applied on the second active layer 205 in operation 511.

An adhesive layer 199 is applied on one of the fourth electrode 207 of the organic solar cell 200 and the second electrode 107 of the organic light emitting diode 100 in operation 513. The organic solar cell 200 and the organic light emitting diode 100 are laminated together such that the fourth electrode 207 of the organic solar cell 200 and the second electrode 107 of the organic light emitting diode 100 are separated by the adhesive layer 199.

In one embodiment, at least one of the third electrode 203 and the fourth electrode 207 is transparent. Both the third electrode 203 and the fourth electrode 207 may be transparent.

At least one of the first active layer 105 and the second active layer 205 may include multiple layers (e.g., a hole transport layer and an electron transport layer).

The organic light emitting diode 100 may have an absorption range in the ultra violet or blue range and may emit light between green and red wavelengths. The light emitted from the organic light emitting diode 100 may be absorbed by the organic solar cell 200.

In another embodiment, the first substrate 101, the second substrate 201, the first electrode 103, the second electrode 107, the third electrode 203 and the fourth electrode 207 may be transparent such that light can transmit through the organic solar cell and organic light emitting diode stack 300.

To operate the stack cell 300, a rechargeable battery is needed. When the stacked cell 300 is illuminated by a light source, the OPV sub-cell 200 converts light into electricity and stored in the rechargeable battery. When there is no light, the electricity stored in the battery can be used to power the OLED 100 and produce light. Since the stacked cell 300 is preferably transparent, with illumination, there is still light penetrating through. Even if there is no external light source, the OLED 100 can emit light. Thus the stack cell 300 can be also used as a 24-hour lighting source. Patterns of the OPV 200 and the OLED 100 can be designed, so the stacked cells 300 can also be used for a display, signs, labels, commercial advertisements, and the like.

Figure 10:
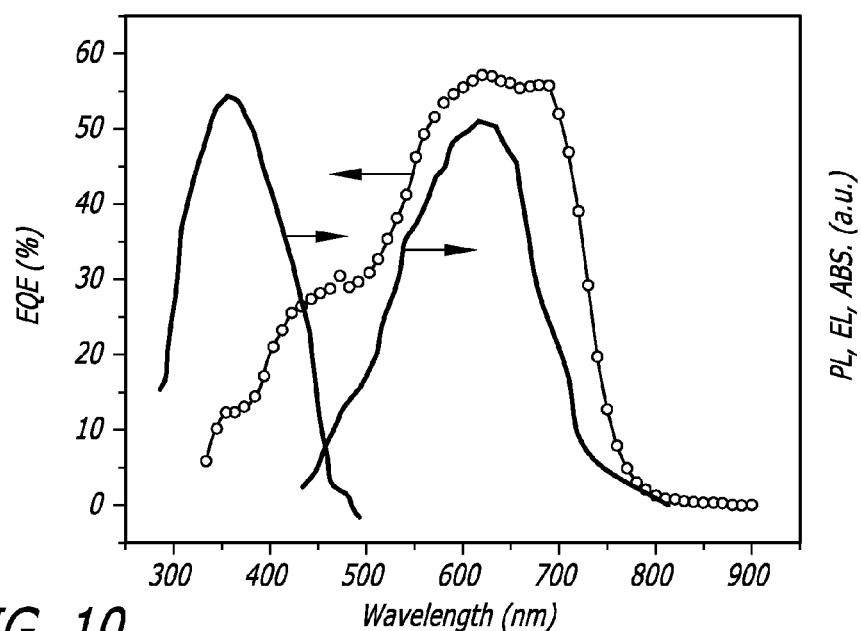
FIG. 10 is a graph illustrating a relationship between absorption and emission spectra of an example substance in an organic light emitting diode sub-cell and an external quantum efficiency of an organic solar cell.

Furthermore, the selection of materials for the OLED 100 and OPV 200 are critical. Preferably, the absorption range of the OLED 100 material is in UV or blue range in order to have less overlap with the absorption range of the OPV 200 material. For example, as shown in FIG. 10, the solid curves represent the absorption spectrum and emission spectrum of the OLED 100, while the circle curve shows the Incident-Photon-to-Electron Conversion Efficiency (IPCE) curve of an OPV 200. The OLED 100 material can absorb UV and blue light where the OPV 200 may have less absorption, while the OLED 100 material emits longer wavelength light, such as green and red, which the OPV 200 can absorb. Therefore, the OLED 100 can further increase the light conversion efficiency of the OPV 200 when the OPV sub-cell 200 is facing a light source. If the OLED sub-cell 100 is facing a light source, the OLED 100 can convert UV or shorter wavelength light to longer wavelength light which is less damaging to the OPV sub-cell 200 than shorter wavelength light, especially UV light (FIGS. 6 and 7).

As mentioned above, the OPV 200 or OLED 100 can be encapsulated or not before stacking. If the OPV 200 and OLED 100 have been encapsulated, the adhesive layer does not necessarily have to be water and oxygen tight.

FIGS. 8A-8B show another embodiment of a stacked cell, in this case stacked cell 1000. FIG. 8A shows a special substrate 705 with transparent electrodes 703 and 707, on both sides of the substrate 705. Two electronic glue-like (e-glue) or conducting glue layers 701a and 701b are deposited on top of the two electrodes 703 and 707. The electrode 707 or 703 and the glue layers 701a or 701b can be two different layers such as ITO/conducting glue or a composite single layer, such as PEDOT/carbon nanotube.

The organic solar cell and the organic light emitting diode stack 1000 comprises an organic solar cell portion 600. The organic solar cell portion includes a first substrate 603, a first electrode 602 on the first substrate 603 and a first active layer 601 on the first electrode 602. There is a connection portion 700 that includes the second substrate 705. The second substrate 705 has a second electrode 707 on one side and a third electrode 703 on another side of the second substrate 705. There is an organic light emitting diode portion 800. The organic light emitting diode portion 800 includes a third substrate 801, a fourth electrode 803 on the third substrate 801 and a second active layer 805 on the fourth electrode 803.

The organic solar cell portion 600 is laminated to the connection portion 700 such that the first active layer 601 and the second electrode 707 are separated by a first electronic adhesive layer 701b. The connection portion 700 is laminated to the organic light emitting diode portion 800 such that the second active layer 805 and the third electrode 703 are separated by a second electronic adhesive layer 701a.

The OPV 600 and OLED 800 (without the top electrode) film can also be made by similar process as described above for method 500. Then the OPV 600 and OLED 800 will be stacked as shown in FIG. 8B. The conducting glue or e-glue layers provide the mechanic force to hold the stack cell 1000 together.

Figure 9:
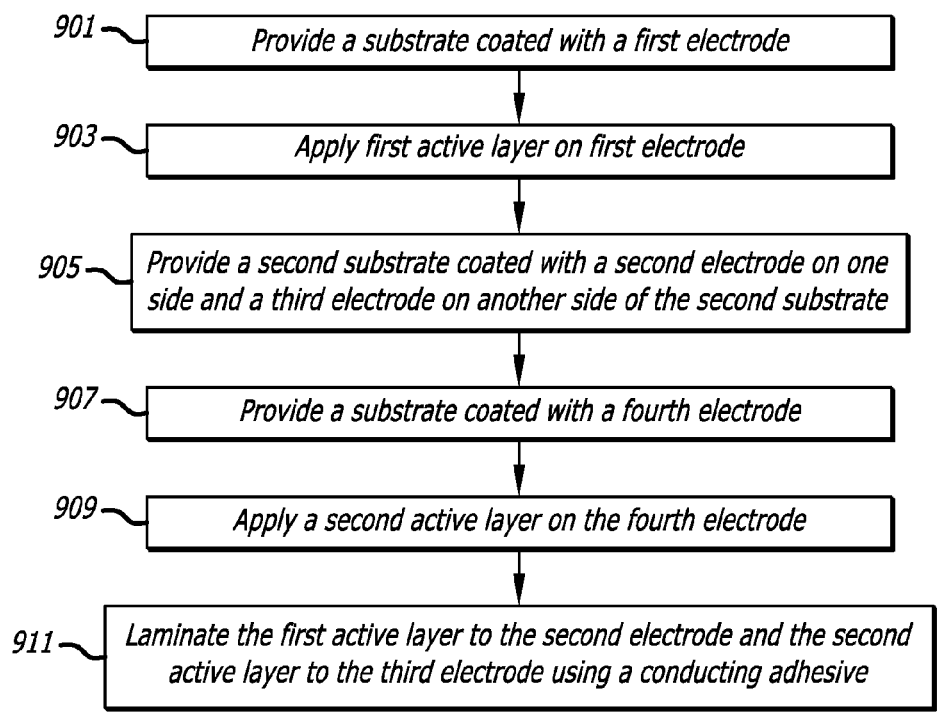
FIG. 9 is a process flow diagram for a method of fabricating an organic solar cell and organic light emitting diode stack, in accordance with the present disclosure.

Referring to FIG. 9, there is a method 900 of fabricating an organic solar cell and organic light emitting diode stack 1000. The method comprises providing an organic solar cell substrate 603 coated with a first electrode 602 in operation 901. In operation 903, a first active layer 601 is applied on the first electrode 602. In operation 905, a second substrate 705 coated with a second electrode 707 on one side and a third electrode 703 on another side of the second substrate 705 is provided. In operation 907, an organic light emitting diode or third substrate 801 coated with a fourth electrode 803 is provided and a second active layer 805 on the fourth electrode 803 is provided in operation 909. In the final operation 911, the first active layer 601 is laminated to the second electrode 707 and the second active layer 805 is laminated to the third electrode 703 using an electronic adhesive 701a-701b.

In one embodiment, at least one of the third electrode 703 and the fourth electrode 803 is transparent. Preferably, both the third electrode 703 and the fourth electrode 803 are transparent. At least one of the first active layer 601 and the second active layer 805 includes multiple layers having a hole transport layer and an electron transport layer.

In one embodiment, the organic light emitting diode portion 800 has an absorption range in the ultra violet or blue range. The organic light emitting diode portion 800 can be fabricated to emit light between green and red wavelengths such that the light emitted from the organic light emitting diode portion 800 can be absorbed by the organic solar cell portion 600. The organic light emitting diode 800 can have an absorption range in the ultra violet or blue range. The organic light emitting diode 800 can emit light between green and red wavelengths and such that the light emitted from the organic light emitting diode portion 800 can be absorbed by the organic solar cell portion 600.

In one embodiment, the organic solar cell substrate 603, the organic light emitting diode substrate 801, the second substrate 705, the first electrode 602, the second electrode 707, the third electrode 703 and the fourth electrode 803 are transparent such that light can transmit through the organic solar cell and organic light emitting diode stack 1000.

In one embodiment at least one of the third electrode 703 and the fourth electrode 803 are transparent. Preferably, both the third electrode 703 and the fourth electrode 803 are transparent. At least one of the first active layer 601 and the second active layer 805 may include multiple layers having a hole transport layer and an electron transport layer.

Such a device can be effectively applied on a surface where both a solar panel and an LED display are advantageous. For a solar panel, this usually requires exposure to sun light for at least a portion of the day. For an LED display, this usually requires either a lighting requirement (such as a lamp), a lighted text requirement (such as a road-sign stating the max speed), or graphics for the purpose of communication or art/fashion.

The following processes can be utilized to fabricate OPVs and OLEDs in accordance with the present disclosure:

Thermal annealing: Thermal annealing is a process in which the substrates, which have various layers deposited on top, are provided thermal energy (heat) by placing the substrates on a hot plate, which is maintained at a certain temperature for a certain period of time. The temperature is referred to as the annealing temperature and the time as annealing time. The thermal annealing may also be done by providing the thermal energy in non-contact mode where the substrate does not come in contact with the hot plate (or heat source), such as placing the substrates in an oven under controlled temperature for a certain period of time.

Solvent annealing: Solvent annealing is a process where an organic layer, which has been deposited on top of a substrate that has a bottom contact deposited by solution processing, is allowed to solidify at a controlled slow rate to enhance the self organization in the organic polymer film. This is achieved by dissolving the organic polymer(s) in a high boiling point solvent, such as dichlorobenzene or tricholorobenzene, for depositing the organic polymer film by solution processing. Due to the high boiling point of the solvent, the film is usually wet after it is deposited, which is then allowed to dry in a controlled manner to slow down the time it takes for the film to convert from liquid phase to solid phase. The desired solidification time is between 2 to 20 minutes. A longer solidification time allows the polymer chains in film to align in a highly-ordered crystalline phase which may result in increased efficiency of photovoltaic conversion in the film.

Adding additives to enhance carrier mobility: Adding additives is a technique used in polymer solar cells to improve the morphology and enhance the carrier mobility. One example is adding slight amounts of poor solvent(s) (e.g. alkanedithiols, or nitrobenzene) into the dominant solvent used to make polymer solution (e.g. chlorobenzene or dichlorobenzene). Improved polymer aggregation and crystallinity has been achieved in some polymer systems and so has enhanced carrier mobility. Another example is the addition of electrolytes and salt into polymer blend solutions, which is also shown to improve photocurrent in polymer solar cells.

Thermal evaporation: Thermal evaporation is a common technique, one of the physical vapor deposition (PVD) methods, to deposit thin film materials. In thermal evaporation, the material is heated in a vacuum of $10^{-5}$ to $10^{-7}$ Torr range until it melts and starts evaporating. The vapor then condenses on a substrate exposed to the vapor, which is kept at a cooler temperature to form a thin film. The materials are heated by placing them in a crucible (or boat) which is made of high electrical resistance material such as tungsten, and passing a high current through the boat.

Polymer photoactive layers used in plastic solar cells are usually about 50-200 nm thick. This small thickness results in inefficient absorption because maximum absorption wavelength for a polymer active layer is usually about 650 nm. For example, maximum absorption in a 80 nm thick poly(3-hexylthiophene): [6,6]-phenyl C61-butyric acid methyl ester (P3HT:PCBM) film, the most commonly used active layer, has been shown to be less than 40% efficient at the peak absorption wavelength. At other wavelengths in the absorption range, an even higher percentage of light is transmitted without being absorbed.

The active layer(s) or photoactive layer(s) are typically a bulk-hetero-junction (BHJ) of a p-type donor polymer and an n-type acceptor material. Photons are absorbed in the donor polymer and excitons are generated when the photons are absorbed. The excitons migrate to the donor-acceptor interface, where they are dissociated into free electrons and holes, which are then transported through a 3-dimensional (3-D) interpenetrated network of donors and acceptors in the BHJ film and are collected at the contacts.

Many polymers can be used as the donor polymer in the BHJ film, such as P3HT, poly[2-methoxy-5-(3,7-dimethyloctyloxy)-1,4-phenylene vinylene] (MDMO-PPV), or poly(2-methoxy-5-(2'-ethyl-hexyloxy)-1,4-phenylene vinylene) (MEH-PPV). Other low-band-gap polymers can be used for the active layer as well.

Common acceptor material candidates are PCBM or [6,6]-phenyl $C_{71}$-butyric acid methyl ester ($C_{70}$-PCBM). Other materials such as single-walled carbon nanotubes (CNTs) and other n-type polymers can also be used as the acceptor material.

The active layer can be obtained by spin-coating from a polymer solution in an organic solvent(s). The film can also be obtained by several other solution processing techniques, such as bar-coating, inkjet-printing, doctor-blading, spray coating, screen printing and others known in the art. By using such techniques, a large area of substrate can be covered by a polymer solution with ease and at low costs. Also, flexible substrates can be used to substitute glass, resulting in a translucent and flexible plastic solar cell.

To improve the photovoltaic conversion efficiency of a plastic solar cell, the BHJ film may undergo different treatments. For example, in a P3HT:PCBM system, both solvent annealing and thermal annealing can be used. In the solvent annealing approach, the slow solidification rate of the photoactive layer(s) allows the P3HT polymer chains to be organized into a highly ordered crystalline state, which improves the absorption of light within the polymer, enhances the charge carrier mobility, improves the exciton generation and dissociation efficiency, and results in a highly balanced charge carrier transport. Due to these effects the efficiency of plastic solar cells can be enhanced significantly. Thermal annealing has also been used to partially recover the polymer crystallinity which also improves solar cell performance. Other possible approaches may include solvent mixing, where two or more solvents are used to dissolve the polymer blend or by adding an ionic salt into the photoactive layer(s), as well as other potential interfacial layer modifications known in the art.

A transparent conductive oxide (TCO), ITO, FTO can be deposited on a coated glass (or plastic) substrates to form the anode or bottom electrode or bottom contact 20. The TCO films are obtained by solution processing, sputtering or thermal spray-coating. To enhance the performance of the organic solar cells, the TCO covered glass surface is coated with a conducting polymer, such as poly(ethylenedioxythiophene): poly(styrenesulfonate) (PEDOT:PSS), or polyaniline (PANI).

There are numerous applications that fall under these criteria. In almost all cases, the OPV can be used to power the OLED or charge a battery and the OLED can provide light for the purpose of displaying a pattern or acting as a light source or both. The following can have an OPV/OLED integrated system.

The OPV's can allow streetlights to be replaced in remote locations or in urban areas but without the cost of construction to install wires to connect the lights to grid power. The OLED allows varying colors to be displayed for an attractive pattern or for a bright light source to light the ground. Thin substrates allow for new street light designs to be more aesthetically pleasing. An alternative use could be for lights for parks or bus stations that are not required to produce as much light but instead the aesthetics would be more of a concern.

The OPV can be used to charge a computer or a computer's battery as well as charge a battery within the bag. The OLED can be used as a light source by creating a soft light over a larger area, producing the same amount of light as a typical flashlight but without the glare caused by a brighter light coming from a single point. In addition, the OLEDs could be used as a fashionable display on the bag. Alternatives include the ability to charge a cell phone or integrating the OPV/OLED with a backpack.

The OPV and OLED can be integrated into an umbrella and clothing. The OPV can power the OLED directly or they can charge an internal battery or an external device such as a cell phone. The OLED can be used as a light source, such as a reading light or to illuminate the ground in front of the user when walking, or as a decorative pattern. The OLED can be used as a light source, such as a reading light inside the tent or an outer light to replace bulky lanterns.

The OPV and OLED can be utilized for outdoor safety gear including light signals for rescue. The OPV can charge a battery that can be used in an emergency to light the OLED. In addition, the battery can power a radio transmitter or other emergency signal.

The OPV can directly power the OLED, creating attractive and novel table-top advertisements. The OPV can directly power the OLED or they can charge an internal battery that is used to illuminate a sign at night.

Traffic signs, cones, barriers, and the same for construction sites may also utilize the OPV and OLED. These products are frequently moved from location to location and would be more effective and could improve public safety if LED could be used to attract attention. The OPV, OLED and a battery allow these products to be brighter and more effective without causing any changes in policy from the users. The products could be put into place and they would operate without any extra set-up.

While the apparatus and method have been described in terms of what are presently considered to be the most practical and preferred embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method of fabricating an organic solar cell and organic light emitting diode stack, the method comprising:
    providing an organic solar cell substrate coated with a first electrode;
    applying a first active layer on the first electrode;
    providing a second substrate coated with a second electrode on one side and a third electrode on another side of the second substrate;
    providing an organic light emitting diode substrate coated with a fourth electrode;
    applying a second active layer on the fourth electrode;
    laminating the first active layer to the second electrode and the second active layer to the third electrode using a electronic adhesive.

2. The method of claim 1 wherein at least one of the third electrode and the fourth electrode is transparent.

3. The method of claim 1 wherein both the third electrode and the fourth electrode are transparent.

4. The method of claim 1 wherein at least one of the first active layer and the second active layer includes multiple layers having a hole transport layer and an electron transport layer.

5. The method of claim 1 wherein the organic light emitting diode has an absorption range in the ultra violet or blue range.

6. The method of claim 5 wherein the organic light emitting diode emits light and wherein the light emitted from the organic light emitting diode can be absorbed by the organic solar cell.

7. The method of claim 1 wherein the organic solar cell substrate, the organic light emitting diode substrate, the second substrate, the first electrode, the second electrode, the third electrode and the fourth electrode are transparent such that light can transmit through the organic solar cell and organic light emitting diode stack.

8. An organic solar cell and an organic light emitting diode stack comprising:
    an organic solar cell portion including:
        a first substrate;
        a first electrode on the first substrate;
        a first active layer on the first electrode;
    a connection portion including a second substrate, the second substrate having a second electrode on one side and a third electrode on another side;
    an organic light emitting diode portion including:
        a third substrate;
        a fourth electrode on the third substrate;
        a second active layer on the fourth electrode; and
    wherein the organic solar cell portion is laminated to the connection portion such that the first active layer and the second electrode are separated by a first electronic adhesive layer; and
    wherein the connection portion is laminated to the organic light emitting diode portion such that the second active layer and the third electrode are separated by a second electronic adhesive layer.

9. The stack of claim 8 wherein at least one of the third electrode and the fourth electrode are transparent.

10. The stack of claim 8 wherein both the third electrode and the fourth electrode are transparent.

11. The stack of claim 8 wherein at least one of the first active layer and the second active layer includes multiple layers having a hole transport layer and an electron transport layer.

12. The stack of claim 8 wherein the organic light emitting diode has an absorption range in the ultra violet or blue range.

13. The stack of claim 12 wherein the organic light emitting diode emits light and wherein the light emitted from the organic light emitting diode can be absorbed by the organic solar cell.

14. The stack of claim 8 wherein the first substrate, the second substrate, the first electrode, the second electrode, the third electrode and the fourth electrode are transparent such that light can transmit through the organic solar cell and organic light emitting diode stack.

* * * * *